United States Patent [19]
Samuels

[11] Patent Number: 5,990,746
[45] Date of Patent: Nov. 23, 1999

[54] AMPLIFIER SYSTEM

[75] Inventor: John Samuels, Surrey, United Kingdom

[73] Assignee: Nokia Mobile Phones Limited, Espoo, Finland

[21] Appl. No.: 08/924,992

[22] Filed: Sep. 5, 1997

[30] Foreign Application Priority Data

Sep. 12, 1996 [GB] United Kingdom .................... 9619029

[51] Int. Cl.⁶ ........................................................ H03G 3/30
[52] U.S. Cl. ........................ 330/285; 330/132; 455/245.1
[58] Field of Search ..................................... 330/129, 278, 330/279, 285, 310, 132, 133; 455/234.1, 245.1, 245.2

[56] References Cited

U.S. PATENT DOCUMENTS

| | | | |
|---|---|---|---|
| 3,899,743 | 8/1975 | Csicsatka | 330/22 |
| 4,406,019 | 9/1983 | Ide et al. | 455/245 |
| 5,241,284 | 8/1993 | Nyqvist et al. | 330/297 |
| 5,410,271 | 4/1995 | Arbel | 330/110 |
| 5,465,408 | 11/1995 | Sugayama et al. | 455/245.1 X |
| 5,493,255 | 2/1996 | Murtojarvi | 330/296 |

FOREIGN PATENT DOCUMENTS

| | | |
|---|---|---|
| 0359477 | 3/1990 | European Pat. Off. . |
| 0147762 | 11/1979 | Japan ...................................... 330/285 |
| 0064409 | 5/1980 | Japan ...................................... 330/285 |
| 1155772 | 6/1969 | United Kingdom .................... 330/285 |
| WO 94/01930 | 1/1994 | WIPO . |

OTHER PUBLICATIONS

"Wideband Power Amplifier With Automatic Current Control", Instruments and Experimental Techniques, A.A. Titov, vol. 31, No. 3, May 1, 1998.

"Mobile P–System Satellite System Comparison", International Journal of Satellite Communications, vol. 13, pp. 453–471 (1995), Klaus G. Johannsen.

*Primary Examiner*—Steven J. Mottola
*Attorney, Agent, or Firm*—Perman & Green, LLP

[57] ABSTRACT

An amplifier system for a radio receiver, comprising: amplifier means for amplifying a signal applied to an amplifier input to generate an amplifier output signal; and control means for sensing the amplifier output signal and, in response to a relatively high level of the output signal, controlling the current applied to the amplifier input to maintain the amplifier means in a linear mode of operation.

5 Claims, 4 Drawing Sheets

AMPLIFIER SYSTEM

BACKGROUND OF THE INVENTION

This invention relates to an amplifier system, especially an adaptive amplifier system for a signal receiver, for example a portable telephone handset or satellite receiver.

A radio signal receiver typically includes a chain of filter stages and amplifier stages ("gain stages") through which the received radio frequency signal is passed in series. The filter stages and amplifier stages alternate throughout the chain. The filters filter out unwanted (out of band) frequencies and the amplifiers amplify the remaining signals. The resulting signal passes to a mixer where it is downconverted and it is subsequently demodulated.

Signal receivers that are especially sensitive (those having a high degree of amplification through the chain) may suffer particular problems. To cope with the extreme sensitivity of the signal the receiver must have a very low noise characteristic (known as noise figure); otherwise the noise will tend to be amplified so that it swamps the signal. However, to achieve the required sensitivity relatively many gain stages may be required: possibly three or more gain stages in the receiver's UHF section alone, whereas a typical conventional mobile telephone has only one or two gain stages. And if a three gain-stage UHF section, for instance, is built using the same principles as a standard receiver section its IIP3 ("third order input intercept point") performance will be relatively poor (perhaps 20 dB worse than that of a comparable signal receiver with only one or two gain stages). Therefore, such a signal receiver will be especially vulnerable to interference from unwanted signals—especially signals just outside the band of desired frequencies. The problems will be particularly acute if the signal receiver's filters are low insertion loss filters with relatively little attenuation of signals just outside the desired band.

SUMMARY OF THE INVENTION

According to the present invention there is provided an amplifier system for a radio receiver, comprising: amplifier means for amplifying a signal applied to an amplifier input to generate an amplifier output signal; and control means for sensing the amplifier output signal and, in response to a relatively high level of the output signal, controlling the current applied to the amplifier input to maintain the amplifier means in a linear mode of operation The said current applied to the amplifier input preferably acts to bias the said signal applied to the amplifier input.

The gain of the amplifier means is preferably unaffected, or substantially unaffected, by the operation of the control means.

Preferably, only in response to a relatively high level of the output signal does the control means control the current applied to the amplifier input to maintain the amplifier means in a linear mode of operation—most preferably in a substantially linear mode of operation.

Preferably the amplifier means comprises or consists of an amplifier, most preferably a bipolar transistor or a field effect transistor (FET). The amplifier means may comprise a filter, suitably a band pass filter.

The amplifier system is suitably part of a signal receiver, preferably a radio signal receiver. The signal receiver suitably comprises at least two, and preferably at least three, gain stages coupled in series, suitably between an antenna and a first (or only) mixing means. The said amplifier means is preferably the amplifier means of which ever of those gain stages is closest to the mixing means. The mixing means preferably downconverts the received signals to provide an intermediate-frequency signal. The amplifier system is preferably part of a handset, such as a radio telephone (or "mobile telephone" or "portable telephone") or a pager.

Satellite/mobile telephones demand especially sensitive signal receivers and because of the difference in signal strengths between terrestrial radio signals and signals received from satellites may suffer particularly from problems due to strong out of band interference. For example, one proposed satellite/mobile telephone service is proposed to operate at 2170–2200 MHz and the proposed UMTS terrestrial/satellite telephone network is proposed to operate adjacent to that frequency band. 100 m from a base station the UMTS signal strength may be greater than −30 dBm and since the typical signal strength at the Earth's surface of the satellite/mobile telephone service may be −100 dBm the UMTS signals are likely to present strong potentially interfering signals to a satellite/mobile telephone. Therefore, an amplifier system or signal receiver according to the present invention may advantageously be included in a receiver for signals from a satellite, and/or a satellite/mobile phone.

BRIEF DESCRIPTION OF THE DRAWINGS

The present invention will now be described, by way of example only, with reference to the accompanying drawings in which.

DETAILED DESCRIPTION OF THE INVENTION

The embodiment of the invention that is illustrated in the figures is an amplifier system for a satellite/mobile telephone handset. The amplifier system comprises a gain section which includes an amplifier. There is a control circuit which senses the level of the signal output by the amplifier and as the level rises the control circuit increases the current applied to the signal input of the amplifier in order to improve the amplifier's linearity.

Figure 1:
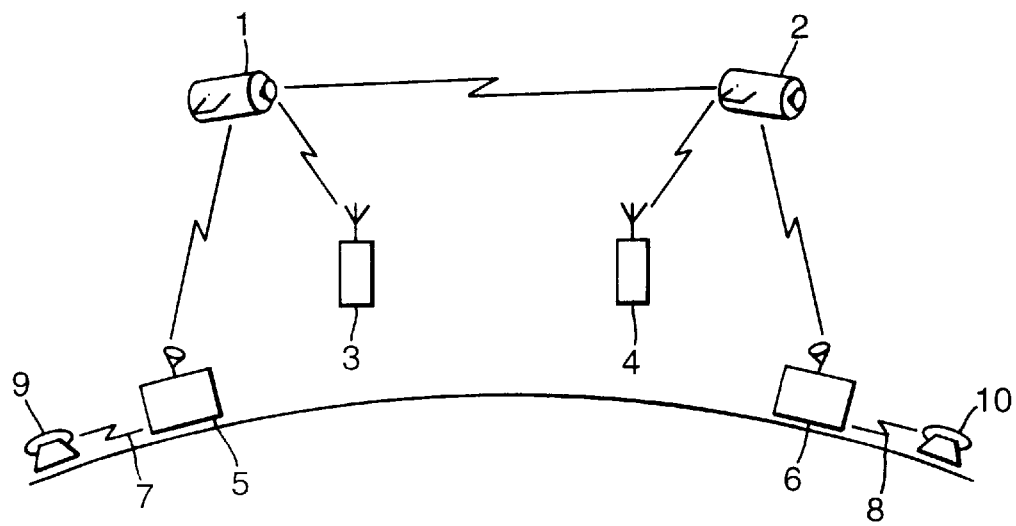
FIG. 1 is a schematic block diagram of a satellite/mobile telephone system.

Referring to FIG. 1, the satellite/mobile telephone system has earth-orbiting satellites 1, 2 which may communicate with each other, with telephone handsets 3, 4 and with gateways 5, 6 to land-line telephone systems 7, 8. (In practice the system would typically have more than two satellites and would support numerous mobile telephones). Through communication with the satellites the mobile telephones can make and receive telephone calls between each other, and to and from telephones 9, 10 connected to the land-line systems. Such systems are discussed generally in "Mobile P-System Satellite System Comparison"; International Journal of Satellite Communications, Vol. 13, 453–471 (1995).

The distance between any of the mobile telephones and the satellite with which it must communicate may be 40,000 km or more, depending on the altitude of the satellite's orbit and the number of satellites the system employs. Therefore, compared to terrestrial mobile telephone systems the signal received by satellite/mobile telephones will typically be of a relatively low strength and more prone to interference.

Figure 2:
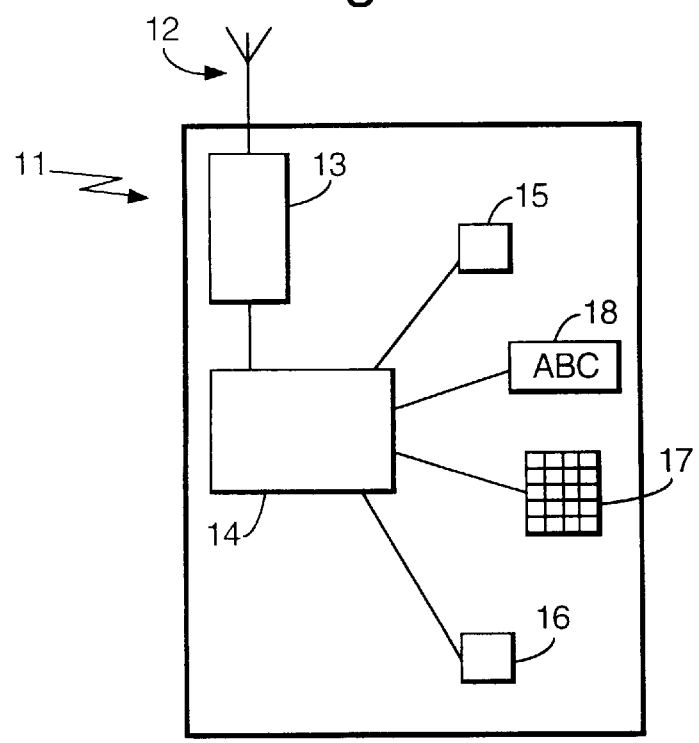
FIG. 2 is a schematic block diagram of a satellite/mobile telephone handset.

Referring to FIG. 2, a satellite/mobile telephone handset 11 (such as telephone handset 3 or 4 in FIG. 1) has an antenna 12; a radio frequency (RF) section 13 for processing the received signals down to baseband and for generating the RF signals to be transmitted by the antenna; and a processor section 14 which contains microprocessors for controlling the telephone and linking the RF section to a speaker 15 and microphone 16. A keypad 17 and display 18 are linked to the processor section to allow a user to control the telephone.

Figure 3:
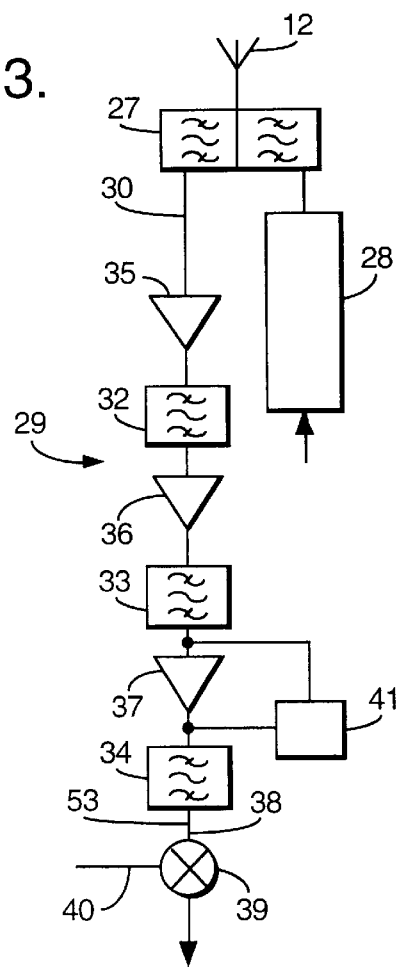
FIG. 3 is a schematic diagram of the electronic architecture of part of the telephone handset shown in FIG. 2.

FIG. 3 shows the RF section 13 of the telephone 11 in more detail. A duplexer 27 (or another suitable arrangement, such as a switch) connects the antenna 12 to a UHF transmitting circuit indicated generally at 28 and a UHF receiving circuit 29. In the receiving circuit, from the point 30, there is a chain alternating with band-pass filters 32, 33, 34 and amplifiers 35, 36, 37. The signal output at 38 from the chain enters a mixer 39 where it is downconverted to an intermediate-frequency signal by mixing with a locally generated signal at 40.

Figure 4:
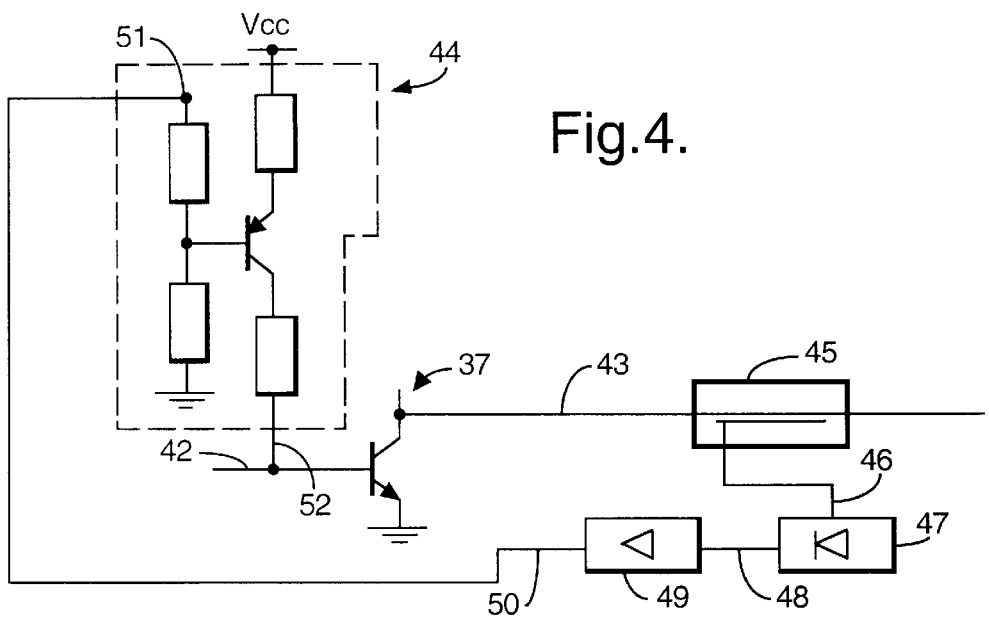
FIG. 4 shows in more detail a loop circuit for controlling the IIP3 of an amplifier of the telephone handset.

Interference in the signal at 30 is likely to cause the greatest problem at amplifier 37 because the signal that is processed by that amplifier has already passed through two gain stages. To help overcome this problem the final gain stage has an additional control circuit 41 which is shown in more detail in FIG. 4. FIG. 4 shows the amplifier 37, in which amplification is provided by a bipolar transistor. The input 42 to the amplifier is connected to the base of the transistor and the output 43 from the amplifier is provided from the collector of the transistor. The emitter of the transistor is typically connected to ground. Between the input 42 and the supply voltage Vcc is an active bias circuit 44, normally used for temperature compensation. (Only part of the active bias circuit is shown). The control circuit 41 makes use of parts of the active bias circuit.

In the embodiment of FIG. 4, a coupler 45 is arranged at the output 43 of the amplifier 37 to sense the signal output by the amplifier. The coupler provides an RF signal output at 46, which is coupled from the signal at output 43. The coupler is typically a coupler of around 15 dB.

The output of the coupler passes to a detector 47 which converts the output of the coupler to a voltage at 48 which is dependent on the level of the output at 43. The detector is, for example, a diode.

The voltage at 48 passes to a voltage gain circuit 49 (an amplifier, for instance) which mirrors and amplifies (by, say, 20 times) changes in the voltage at 48. (The voltage at 50 increases as the voltage at 48 decreases, and decreases as the voltage 48 increases). In appropriate circuits the voltage gain circuit 49 could be provided by, for example a difference amplifier.

Finally that amplified signal is connected at 51 to the active bias circuit. (In a typical prior art active bias circuit the point 51 would be connected directly to Vcc).

The operation of the control circuit 41 will now be described in more detail. When a strong interferer in the signal at 30 reaches amplifier 37 the level of the output signal at the input to the coupler 45 will rise. As a result the level of the signal at 46 coupled from the signal at 43 will also rise, as will the voltages output by the detector 47 and then the voltage gain circuit 49 will cause the voltage at 51 to reduce. This will cause the current injected at 52 by the active bias circuit into the input of amplifier 37 to increase. Hence, the linearity of the amplifier (as measured by its IIP3 for example) will tend to improve whilst its gain remains constant. The effect of this will be to reduce the de-sensitisation and distortion in the output at 43, caused by the strong interferer, of the in-band signals. The active bias circuit will be especially effective in reducing adverse effects of out of band interferers which are not adequately attenuated by the filters 32 and 33 and the duplexer 27.

Figure 5:
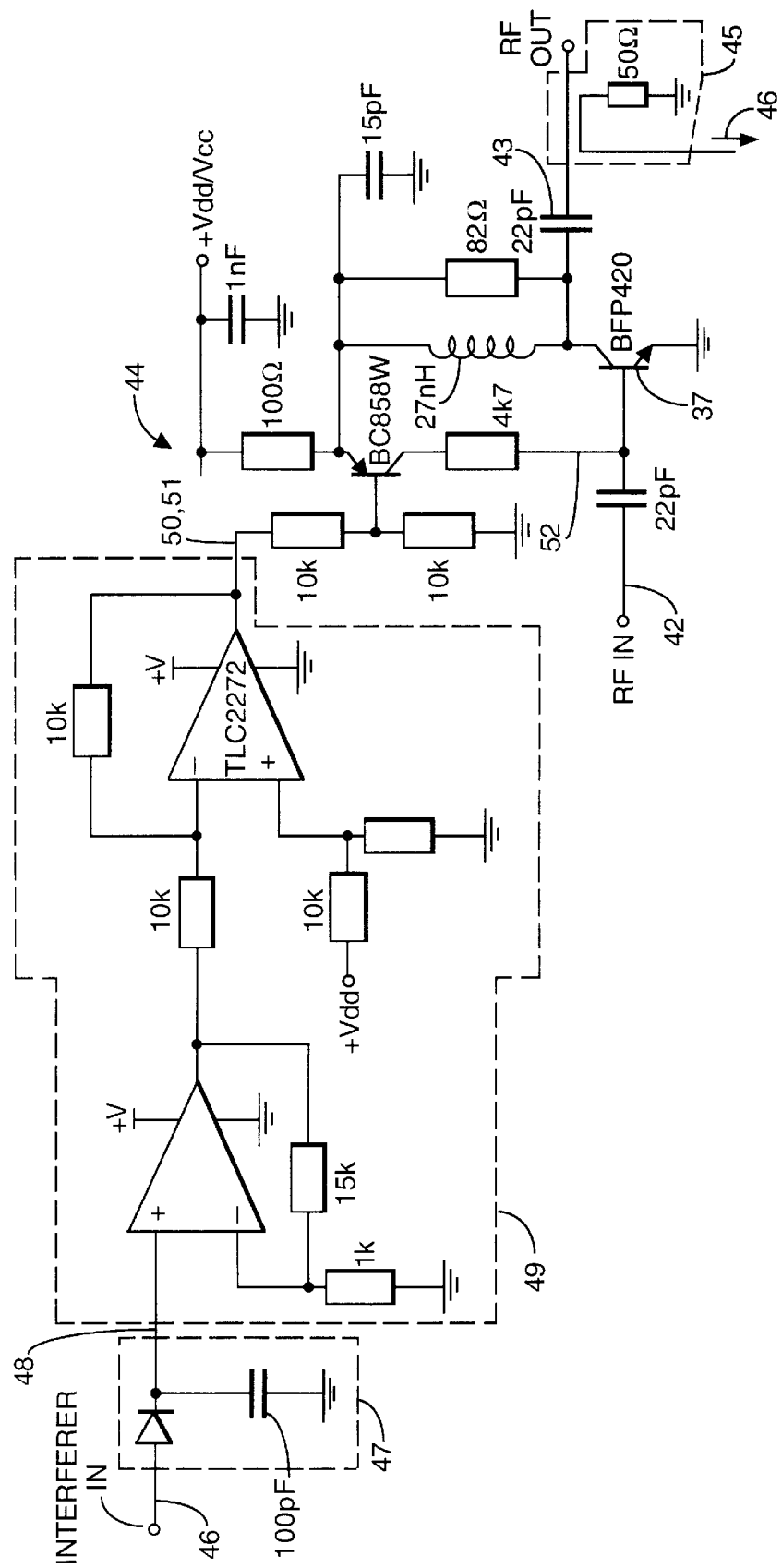
FIG. 5 shows in more detail one example of an adaptive loop circuit.

FIG. 5 shows in more detail one example of a suitable adaptive loop circuit, using the same reference numerals as FIGS. 1 to 4.

For a typical amplifier, the injected current at 52 may be around 5 mA when the adaptive loop (constituted by the coupler 45, the detector 47 and the voltage gain circuit 49) is actuated by a strong interferer. This injection of current improves the linearity of the amplifier 37 especially at high signal levels, with the aim of maintaining the amplifier in a linear mode of operation. The response of the voltage gain circuit 49 can be chosen to provide the desired level of injected current to the amplifier 37.

When current is injected at 52 by the adaptive loop the amplifier will be expected to use more power. Therefore the loop may be arranged so that at lower signal strengths (e.g. −90 dBm) the loop is not (or is barely) actuated, because zero volts (or only a little over zero volts) is output from the detector and the voltage amplifier operates at maximum gain performance, with the voltage at point 51 being close to Vcc. Thus, it may be arranged so that at relatively low signal strengths the loop has little or no significant effect on the linearity of the amplifier. As signal strength rises the current injected due to the adaptive loop increases. The loop may cause especially high injection of current for signal strengths of greater than, say, −15 dBm; and possibly up to, say, 5 dBm.

The coupler 45 could be located (at 53 in FIG. 3) after the filter 34 following the amplifier 37, to sense the output of that filter rather than the direct output of the amplifier 37. The adaptive loop 41 could be applied to any of the amplifiers of the chain—sensing the output of the amplifier or a signal dependant on that output and feeding back current into the input of the amplifier or into a signal on which that input is dependant. It is preferable for the amplifier to which the loop is applied to be farther from the antenna, most preferably the last amplifier of the chain, as in FIG. 3.

Figure 6:
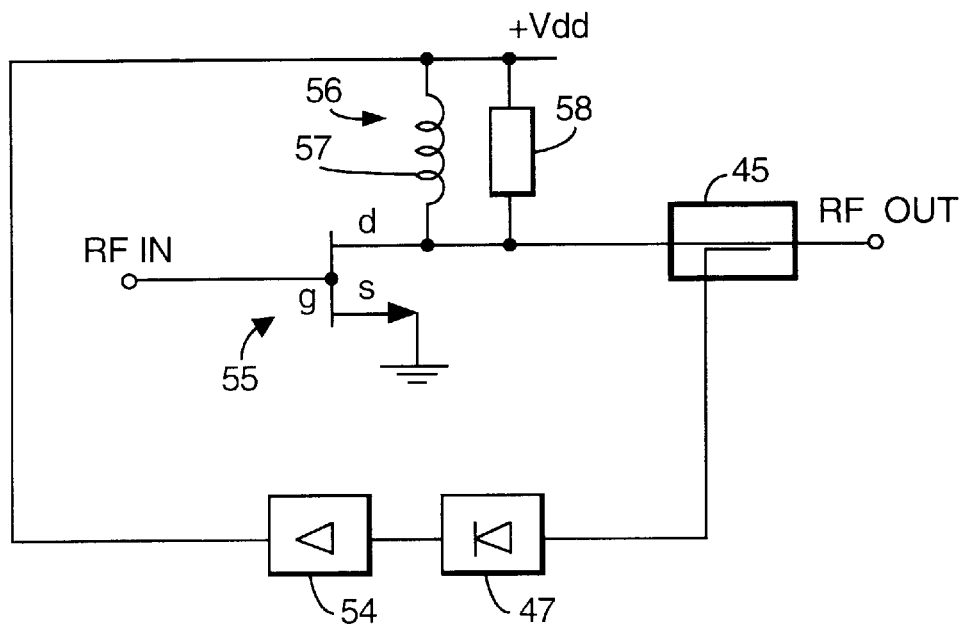
FIGS. 6 and 7 show circuits analogous to that of FIG. 4 for the situation where the amplifier is a FET.
Figure 7:
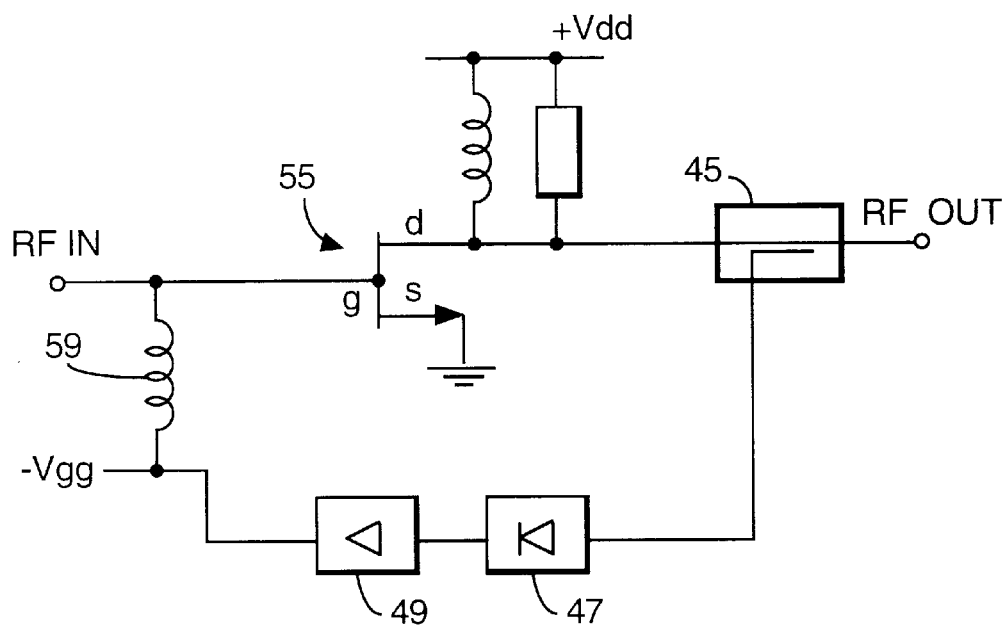

FIGS. 6 and 7 show circuits analogous to that of FIG. 4 for the situation where the amplifier is a FET. Similar components are numbered as for FIGS. 1 to 5. The aim of the circuit of FIG. 6 is to increase the drain voltage of the FET as the signal strength at the output of the FET rises. In FIG. 6 the voltage gain circuit 54 does not mirror the voltage at 48. Therefore, in FIG. 6 the voltage at 51 rises as the voltage at 48 rises, to adaptively control the FET 55 through a link 56 (consisting of an inductor 57 and a resistor 58) to the drain of the FET. The aim of the circuit of FIG. 7 is to decrease the gate voltage of the FET as the signal strength at the output of the FET rises. In FIG. 7, the link consists of an inductor 59.

The present invention includes any novel feature or combination of features disclosed herein either explicitly or implicitly or any generalisation thereof irrespective of whether or not it relates to the claimed invention or mitigates any or all of the problems addressed.

In view of the foregoing description it will be evident to a person skilled in the art that various modifications may be made within the scope of the invention.

What is claimed is:

1. A radio receiver comprising:

an antenna for receiving signals from a remote source;

a mixer for processing the signals received by the antenna and converting said signals to an intermediate signal; and an amplifer system connected to the antenna for filtering and amplifying the signals from the antenna for receipt by the mixer, said amplifier system further comprising:

a plurality of amplifiers connected in a cascade; and a control circuit connected to the output of one of said amplifiers to detect signals at said output which are indicative of the presence of signals outside of the operating band of the amplifier, and to feedback a signal to the input of said amplifier in response to said detected signal, said feedback signal causing an adjustment of the bias current to said amplifier to maintain the operation of said amplifier in the linear range.

2. A radio receiver, as described in claim 1, wherein the amplifier to which the control circuit is connected is constructed having an active bias circuit which injects a current to the input of the amplifier and the feedback signal of the controller is connected to said active bias circuit to increase the current injected in response to amplifier output signals in excess of a predetermined value.

3. A radio receiver, as described in claim 1, wherein the control circuit comprises:

a coupler connected to receive the output signal of the amplifier;

a detector operatively connected to the coupler to detect signals at the output of said amplifier which exceed a predetermined value; and a difference amplifier connected to said detector to inversely amplify the signal from the detector and transmit it to the active bias circuit of said amplifier.

4. A radio receiver, as described in claim 1, wherein each of the amplifiers in the cascade is followed by a filter element.

5. A radio receiver, as described in claim 1, wherein the control circuit is connected to the output of the last of the amplifiers in the cascade before the mixer.

* * * * *